(12) United States Patent
Heid

(10) Patent No.: US 6,636,038 B1
(45) Date of Patent: Oct. 21, 2003

(54) METHOD AND APPARATUS FOR CONTROLLING A PULSE SEQUENCE IN A MAGNETIC RESONANCE TOMOGRAPHY SYSTEM

(75) Inventor: Oliver Heid, Gunzenhausen (DE)

(73) Assignee: Siemens Aktiengesellschaft, München (DE)

( * ) Notice: Subject to any disclaimer, the term of this patent is extended or adjusted under 35 U.S.C. 154(b) by 57 days.

(21) Appl. No.: 09/648,628

(22) Filed: Aug. 28, 2000

Related U.S. Application Data

(63) Continuation-in-part of application No. 09/084,168, filed on May 26, 1998, now abandoned.

(30) Foreign Application Priority Data

May 28, 1997 (DE) .......................................... 187 22 483
Apr. 23, 1998 (DE) .......................................... 198 18 292

(51) Int. Cl.[7] ................................................. G01V 3/00
(52) U.S. Cl. ........................ 324/314; 324/307; 324/309
(58) Field of Search ................................. 324/314, 307, 324/309, 318, 322, 122

(56) References Cited

U.S. PATENT DOCUMENTS

| | | | |
|---|---|---|---|
| 4,931,760 A | * 6/1990 | Yamaguchi et al. | ........ 324/319 |
| 5,144,242 A | 9/1992 | Zeilenga et al. | |
| 5,349,296 A | 9/1994 | Cikotte et al. | |
| 5,512,825 A | 4/1996 | Atalar et al. | |
| 5,519,320 A | 5/1996 | Kanayama et al. | |
| 5,581,183 A | 12/1996 | Lindstedt et al. | |
| 5,606,258 A | 2/1997 | Hoenninger, III et al. | |
| 5,726,571 A | * 3/1998 | Guclu et al. | ................. 324/307 |
| 6,044,290 A | * 3/2000 | Vigen et al. | ................. 324/306 |
| 6,230,039 B1 | * 5/2001 | Stuber et al. | ............... 324/307 |
| 6,275,038 B1 | * 8/2001 | Harvey | ....................... 324/307 |

* cited by examiner

Primary Examiner—Diego Gutierrez
Assistant Examiner—Dixomara Vargas
(74) Attorney, Agent, or Firm—Schiff Hardin & Waite

(57) ABSTRACT

In a method for the control of the pulse sequence for a nuclear magnetic resonance tomography system and apparatus for the implementation of the method, the calculation of a control dataset is undertaken during the running time of the sequence, so that the sequence execution can be non-deterministically controlled with minimum dwell time with optimum utilization of the gradient system.

16 Claims, 11 Drawing Sheets

METHOD AND APPARATUS FOR CONTROLLING A PULSE SEQUENCE IN A MAGNETIC RESONANCE TOMOGRAPHY SYSTEM

RELATED APPLICATION

The present application is a continuation-in-part of Ser. No. 09/084,168, filed May 26, 1998, and now abandoned.

BACKGROUND OF THE INVENTION

1. Field of the Invention

The present invention is directed to a method as well as to an apparatus for controlling the pulse sequence in a nuclear magnetic resonance tomography system.

2. Description of the Prior Art

For the measuring sequence in a nuclear magnetic resonance tomography system, it is essentially the time curve of gradient currents, radio-frequency transmission pulses and sampling periods for the acquired MR signal that are to be controlled. In currently standard control systems, the control data sets are pre-calculated before the sequence starts. Stored time curves are thereby employed, for example for the leading and trailing edges of gradient currents. The measuring procedure is then "played" in the form of a list during the sequence execution. Such a controller is disclosed, for example, by U.S. Pat. No. 5,349,296.

Since the entire sequence execution is already determined at the start of the sequence, the further sequence execution can be influenced only with difficulty and in a very limited way after the sequence starts. Essentially, only a built-in stopping and waiting for an external trigger signal is possible. A large data volume must be stored. In order to keep this data volume somewhat within limits, parts of the sequence topology are typically imaged in the form of a loop structure. For example, loop instructions are contained in the dataset. The description "language" for the dataset thus becomes complex and inflexible.

U.S. Pat. No. 5,144,242 discloses a control arrangement for an MR apparatus wherein a memory for control commands is continuously reloaded from a bulk storage while the sequence is being processed. The memory for control commands is thus relieved. A similar control arrangement is also disclosed in U.S. Pat. No. 5,606,258.

German OS 44 35 183 discloses a method for the operation of a magnetic resonance apparatus wherein time-variable magnetic gradient fields are generated dependent on time-variant signals. The time-variant signals are represented by discrete signal values that are generated by a virtual machine by processing a virtual machine program. The processing is based on a prescription of parts of time curves for gradient currents. To that end, normalized time sub-curves (curve portions) are stored as a gradient table in a memory area of the virtual machine. These sub-curves, multiplied by corresponding scaling factors, are reshaped into the required signal values and are compiled to form the required gradient current signal curves. As a result, as in every sequence, occupation of k-space with magnetic resonance image data takes place during a radio-frequency reception phase in combination with a corresponding drive of a radio-frequency system, whereby the sequence program has available the normalized parts of the time curves for gradient currents in the way described above.

U.S. Pat. No. 5,512,825 discloses a method for minimizing dead times for the gradient start and end values as well as to specify a moment for the gradient curve.

In the definition of gradients, a distinction must be made between what are referred to as "logical" gradients and the "physical" gradients. This distinction is necessary because that arbitrarily oblique slices can be imaged with nuclear magnetic resonance tomography apparatus. These oblique layers are defined by prescribing logical gradients that are oriented correspondingly oblique in a Cartesian coordinate system. Each gradient coil, of course, can supply only one gradient in a defined direction, namely only in one axis of a physical Cartesian coordinate system. These gradients are referred to as physical gradients. The oblique logical gradients are therefore generated by superposition of physical gradients, by a vector addition as considered mathematically. The following problem, however, arises. In conventional systems, the logical gradients are typically defined in the form of trapezoidal pulses. Given a superposition of a number of physical gradients, the physical gradients then typically are no longer trapezoidal, but exhibit a complex current-time curve that must be governed by the gradient amplifier. The maximum rise of the gradient edges of the physical is limited by what is referred to as the slew rate in any gradient system. Further, of course, the gradient amplitude is also limited. What rise times and what amplitudes occur in the physical gradients is not predetermined in the definition of the logical gradients since these are calculated from the logical gradients in the sequence execution. On the other hand, the limitation of the rise time and of the amplitudes of the physical gradients must be taken into consideration in the definition of prepared data sets for the logical gradients. For example, the worst case must always be assumed, i.e. that all gradient rises encounter a physical gradient. Only a poor utilization of the gradient hardware is thus possible.

SUMMARY OF THE INVENTION

An object of the present invention is to provide a method and apparatus for the control of a pulse sequence wherein the aforementioned disadvantages are avoided.

This object is inventively achieved in a method and an apparatus wherein a control dataset for gradients (i.e. for the gradient amplifiers) and for radio-frequency pulses and for nuclear magnetic resonance signal sampling (i.e. for the radio-frequency transmission and reception channel) is calculated from sequence data prescribed in the k-space during the running time of the pulse sequence. An intervention into the running sequence, i.e. a modification of the sequence parameters, is thus possible. A low memory capacity requirement is achieved due to a short "dwell" time of a maximum of one time slice during which data must be stored.

DESCRIPTION OF THE PREFERRED EMBODIMENTS

Figure 1:
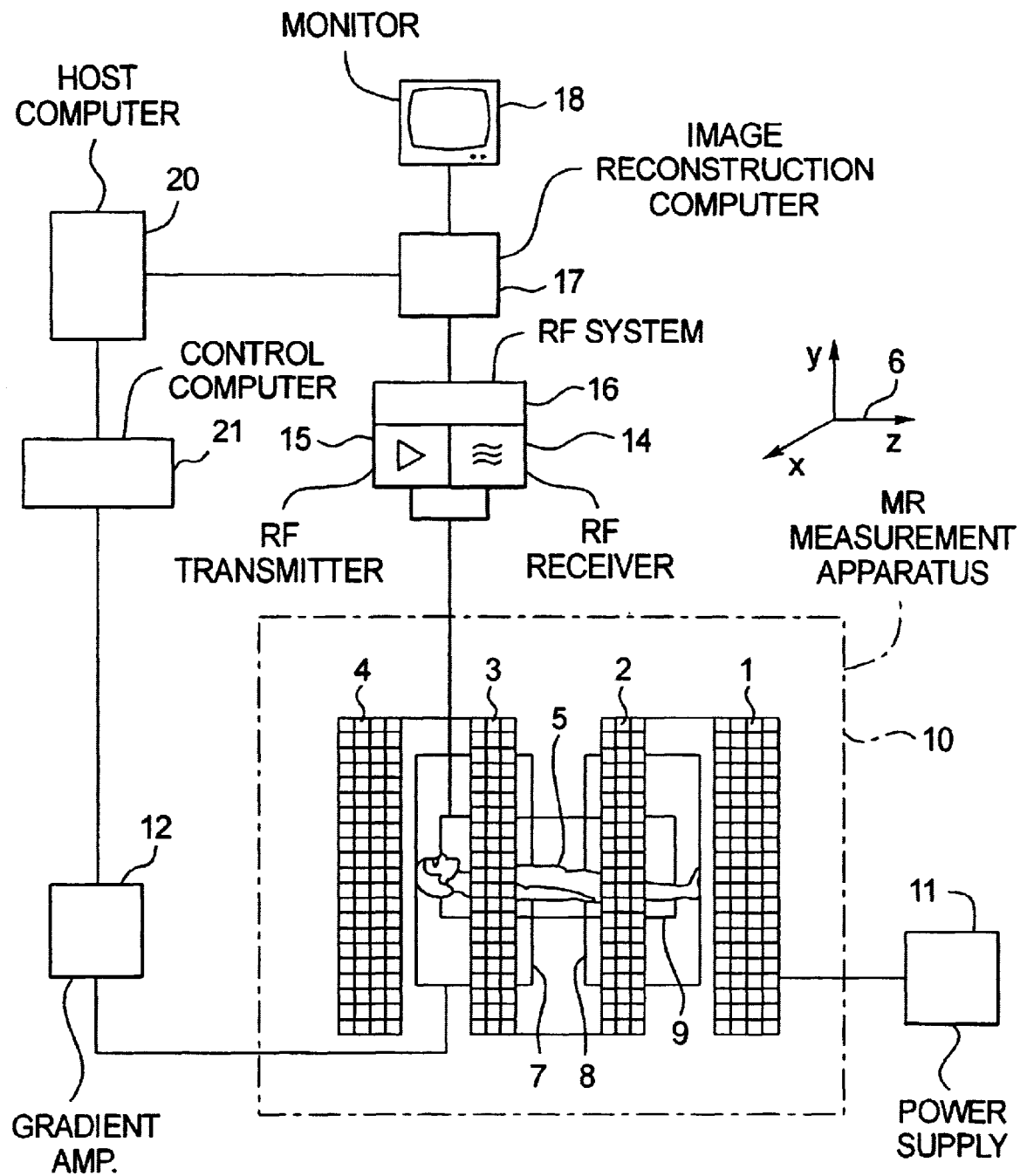
FIG. 1 schematically shows the structure of a nuclear magnetic resonance tomography apparatus in which the inventive method and apparatus can be employed.
Figure 2:
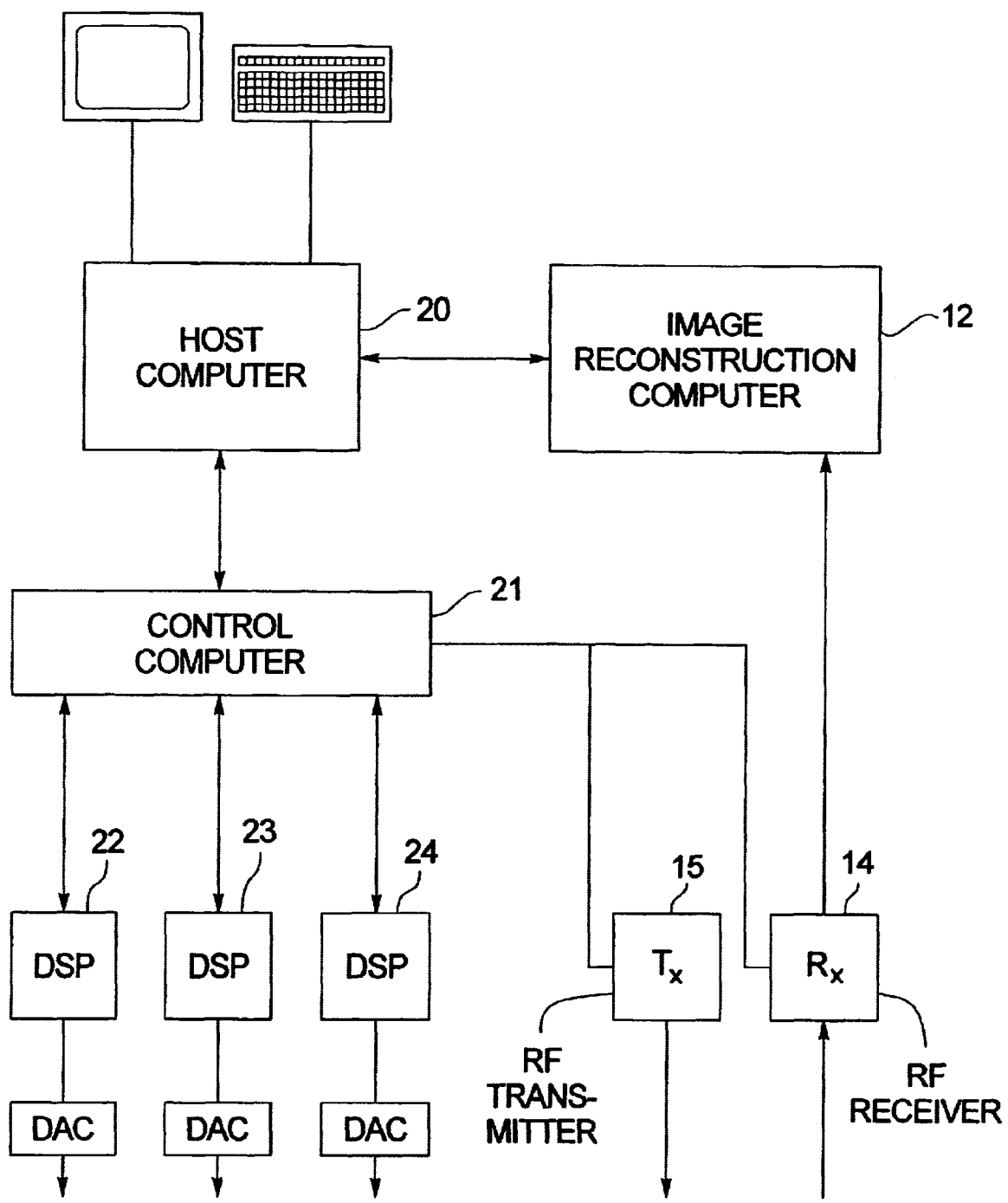
FIG. 2 is a block diagram of the structure of the system controller in greater detail.

FIG. 1 schematically shows the standard structure of a nuclear magnetic resonance tomography apparatus. The apparatus includes a magnet system including coils 1 through 4 which generate a uniform basic field, fed by a power supply 11. Gradient coil systems 7, 8 that are driven by a gradient amplifier 12 are provided in the magnet system. The gradient coil systems 7, 8 are implemented for generating magnetic field gradients in three spatial directions x, y, z of a coordinate system 6. The examination subject 5 is surrounded by a radio-frequency antenna 9 that is connected to a radio-frequency transmission unit 15 as well as to a radio-frequency reception unit 14 disposed outside of the measurement apparatus 10. The radio-frequency transmission unit 15 and the radio-frequency reception unit 14 are components of a radio-frequency system 16 in which, among other things, the received signals are sampled and demodulated in a phase-sensitive manner. An image is produced from the demodulated signals with an image reconstruction computer 17, forwarded to a host computer 20 and displayed on a monitor 18. The entire unit is driven by a control computer 20. The hardware control is assumed by a control computer 21 that is connected to the host computer 20. The entire system control is shown in somewhat greater detail in FIG. 2. The control computer 21 contains a standard CPU on which the actual measuring sequence is executed. At least one radio-frequency transmission unit 15, at least one radio-frequency reception unit 14 and three digital signal processors (DSP) 22, 23 and 24 are coupled to this CPU. Via interrupts, the gradient DSPs 22, 23 and 24 can request data from the controller CPU as soon as their local buffers have been emptied. There is also a digital connection to the image reconstruction computer 17 in order to synchronize the data acquisition with the image reconstruction. A bus to the host computer 20 maintains a real-time connection between the host and the controller CPU in order to provide the user with the possibility of also influencing the measuring execution during the measurement.

Figure 3:
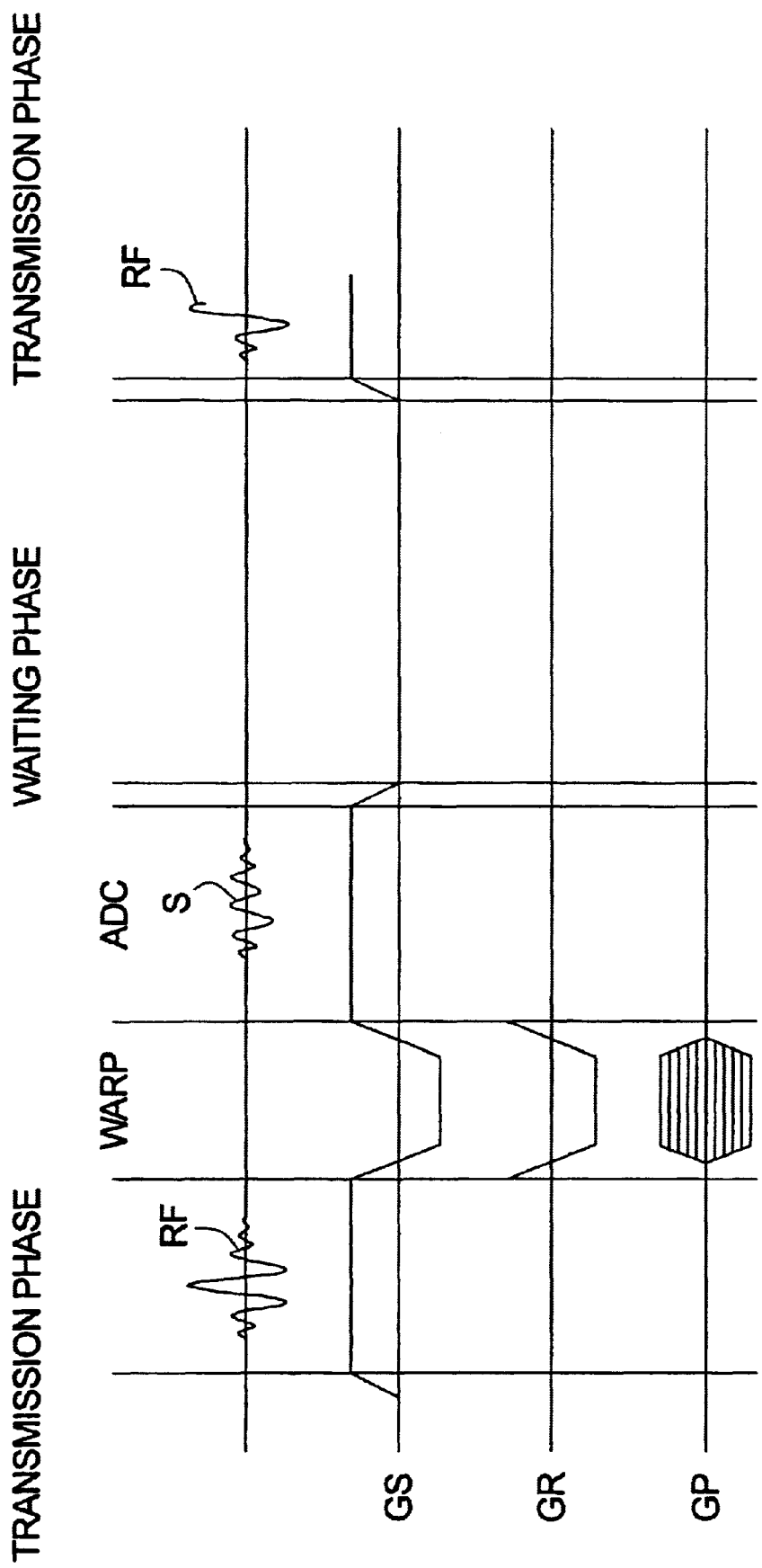
FIG. 3 shows a part of a typical pulse sequence.

FIG. 3 shows an example of a pulse sequence. Each pulse sequence can be divided into a transmission phase in which a radio-frequency pulse is radiated during a defined gradient (GS in FIG. 3 under certain circumstances). Finally, there is a warp phase in which, for example due to a defined gradient time integral, a phase coding of the nuclear spins ensues, or a specific flux encoding, a specific diffusion encoding, etc. A warp phase also serves the purpose of producing the continuity and steadiness of the gradient currents between the adjacent time slices. No radio-frequency activity is permitted during a warp phase.

There is also a reception phase (referenced ADC in FIG. 3) in which the arising signal is sampled with an analog-to-digital converter. The possibility of simultaneously generating defined field gradient (GR in FIG. 3) is provided.

Finally, there are waiting phases in which no gradient fields are active and there is neither transmission nor reception. These can be viewed as being a special case of a warp phase.

The pulse sequence of FIG. 3 is repeated N times with different amplitude-time integrals of the phase encoding gradient GP, so that N differently phase-encoded signals S are obtained. Each signal is sampled m times, and the individual measured values are entered into a row of a raw data matrix RD schematically shown in FIG. 4. This raw data matrix can be considered as being a measured data space, that is generally referred to as k-space. The following definitions are valid for the k-space:

$$k_x(t) = \gamma \int_0^t G_x(t')dt'$$

$$k_y(t) = \gamma \int_0^t G_y(t')dt'$$

$$k_z(t) = \gamma \int_0^t G_z(t')dt'$$

wherein $\gamma$ is the Larmor constant and $G_x$, $G_y$, $G_z$ are the magnetic field gradients in the x, y and z directions of a Cartesian coordinate system, respectively. Transferred to the pulse sequence of FIG. 3, for example, the slice selection gradient GS could lie in the z-direction, the phase encoding gradient GP in the y-direction and the readout gradient GR in the x-direction, so that $$G_z=GS,\ G_y=GP,\ G_x=GR$$

are valid for this case.

Figure 4:
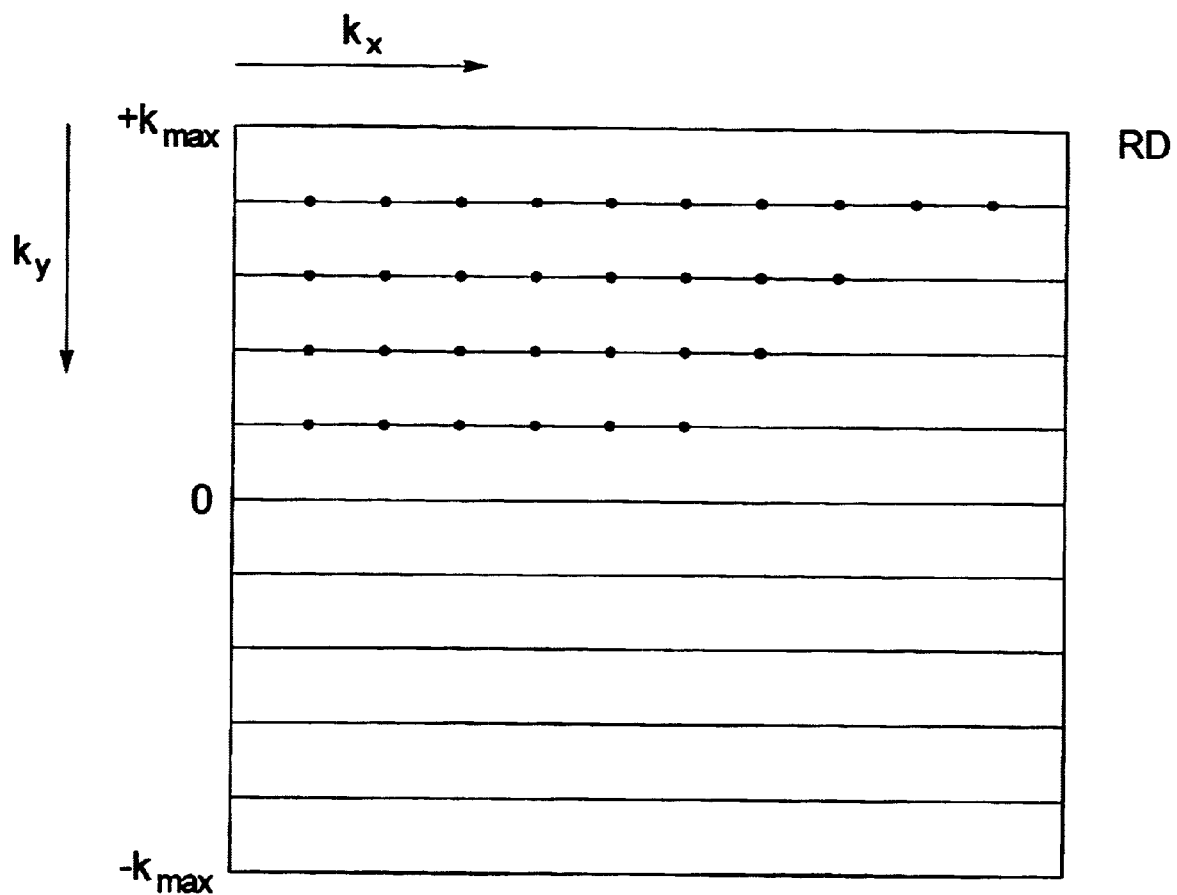
FIG. 4 illustrates the occupation of a raw data matrix in the k-space, with sampled values of nuclear magnetic resonant signals.

A image can then be reconstructed from a raw dataset in the k-space, i.e. from the raw data matrix RD of FIG. 4, since the relationship between the locus space (i.e. the image) and the k-space exists mathematically via the following multi-dimensional Fourier transformation:

$$S(k_x, k_y, k_z) = \iiint \rho(x, y, z)e^{i(k_x x + k_y y + k_z z)}dxdydz$$

wherein $\rho(x,y,z)$ is the spin density distribution and S is the obtained signal. Since the measured values are present as discrete numerical values, the Fourier transformation is implemented as a discrete Fourier transformation with FFT (Fast Fourier Transform) methods.

As mentioned above, each signal S occupies a row of the raw data matrix. Corresponding to the above explanations, the row position is thereby determined by the value $k_y$, i.e. by the time integral over the preceding phase encoding gradient GP.

A task of the pulse sequence controller is to control radio-frequency transmitter, reception channel and gradient amplifier such that exactly the desired pulse sequence is achieved. There are a number of different sequence types that can also be referred to as sequence topology. In a rough classification, these are, for example, gradient echo sequences and spin echo sequences. These groups of pulse sequences can in turn be subdivided farther, for example into FLASH sequences, FISP sequences, turbo-spin echo sequences and EPI sequences, to cite only a few examples. In order to make the operation as simple as possible, various anatomical regions (for example, lumbar spinal column) with respectively optimized pulse sequences are made available in a menu. On the other hand, the user should have the possibility of customizing the pulse sequences to his or her specific requirements.

Figure 5:
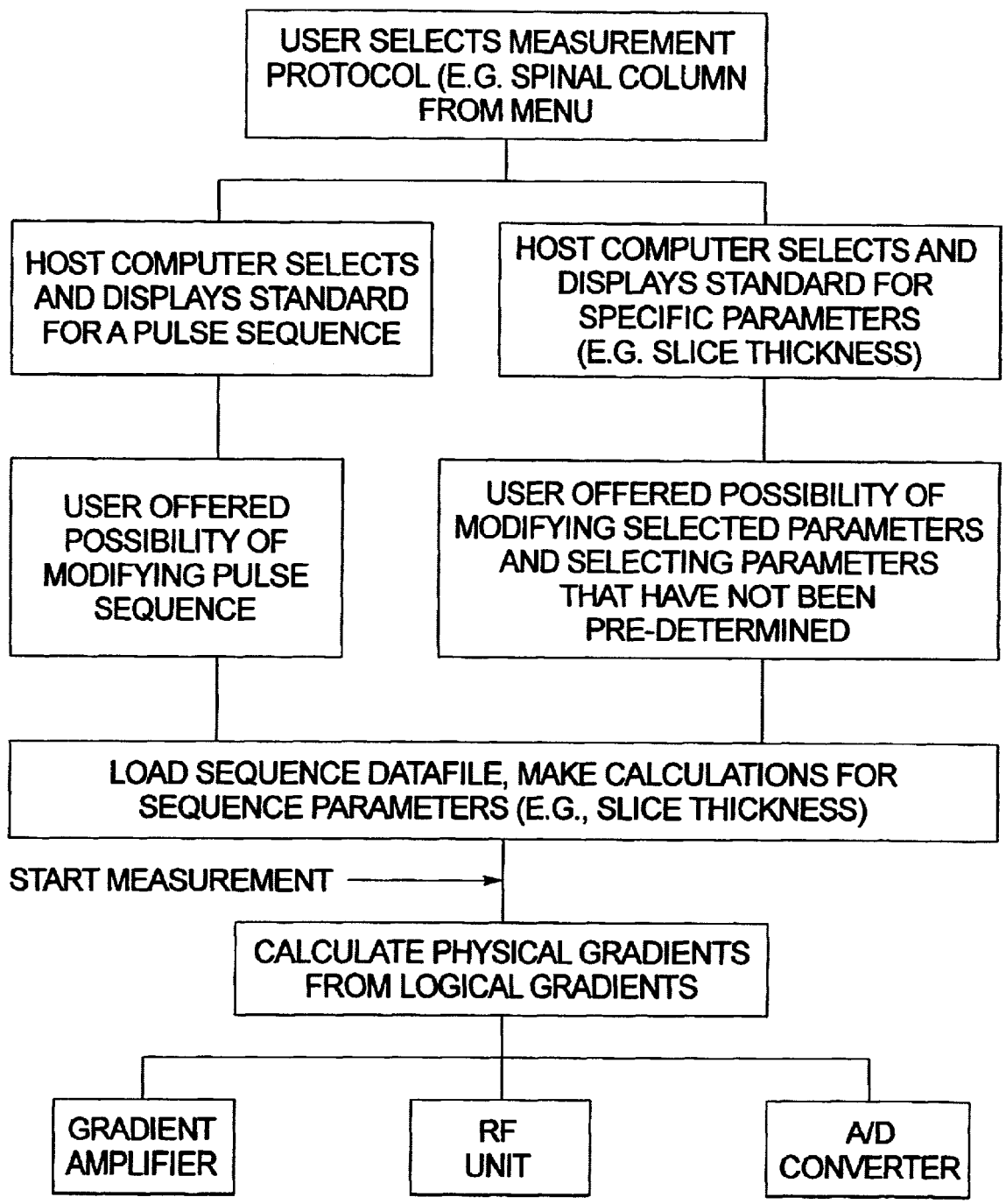
FIG. 5 is a flowchart of a conventional controller.

A flowchart for the execution of a conventional pulse sequence controller is shown in FIG. 5. The user can first select a measurement protocol (for example, lumbar spinal column) from a menu. A HOST computer subsequently selects a standard for a pulse sequence that usually supplies the optimum results for this anatomical region and displays this. The user, however, still has the possibility of modifying this pulse sequence according to his or her own requirements. Every pulse sequence also includes various parameters, for example the repetition time, the echo time, the field of view, the slice thickness, the matrix size and the flip angle. The HOST computer also selects a standard for these parameters on the basis of the anatomy selection and displays these. Here as well, the user has the possibility of modifying selected parameters and selecting parameters, for example the slice angle, that are not predetermined by standard.

On the basis of the selected measurement protocol as well as on the basis of the parameters and sequence modifications set by the user, a sequence data file is now loaded from a "library" and calculations are implemented with reference to sequence parameters (for example, slice thickness). The sequence program converts the measurement parameters into a sequence of "logical" gradient pulses. Three logical gradient current/time functions in the logical coordinate system (phase-encoding, readout and slice direction) arise from the superposition of these pulses. Time-equidistantly sampled, these are then compiled in a gradient curve memory. In order to be able to realize slices that lie obliquely in a physical or Cartesian coordinate system (x, y, z) predetermined by the gradient coil system, the reference current values established in the logical coordinate system are imaged point-by-point into the physical coordinate system. To this end, for example, a matrix-vector multiplication unit as disclosed by U.S. Pat. No. 5,349,296 can be utilized.

A data stream of reference current values, that are forwarded point-by-point to digital-to-analog converters for the drive of the gradient amplifiers, is obtained on the basis of these calculations.

Figure 6:
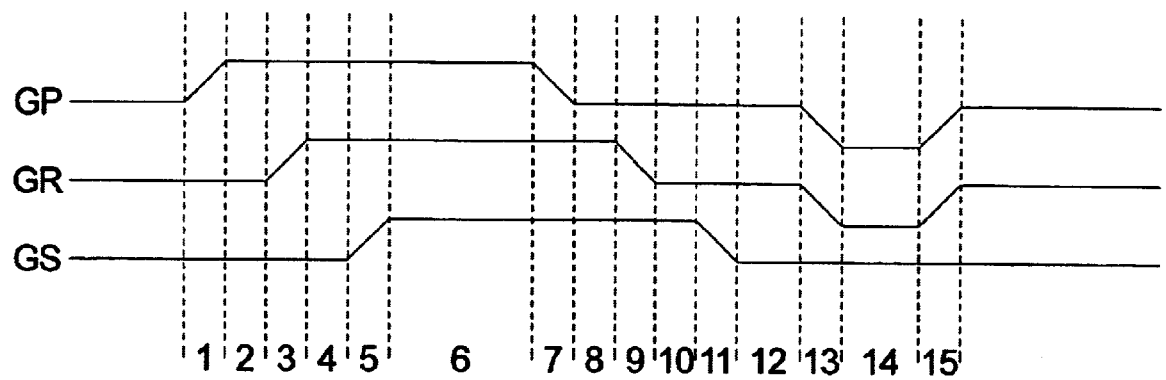
FIG. 6 shows the conventional division of a pulse sequence into individual time slices.
Figure 7:
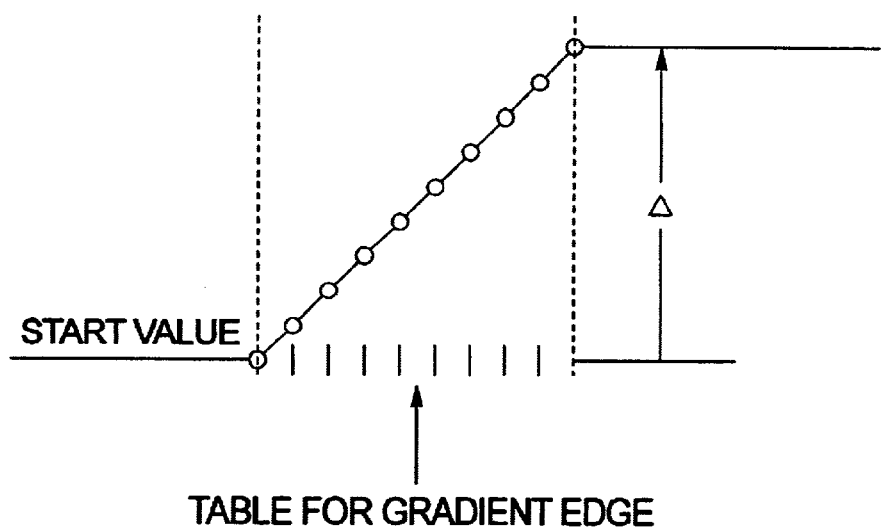
FIG. 7 shows the conventional definition of a gradient leading edge.

As shown in FIG. 6, the overall pulse sequence is resolved into individual time slices for the drive, one action being respectively triggered therein. For example, this action can be keeping all gradients, a leading edge of a specific gradient and a trailing edge of a specific gradient constant. The gradient edges themselves are defined by a start value and a modification Δ within the time slice. The curve of the gradient edge is entered in a table that the pulse sequence controller can access. As shown in FIG. 7, this table can define a linear gradient leading edge, however, there can also be other tables for gradient edges, for example a sinusoidal edge.

As already mentioned, this method wherein the course of the gradients, radio-frequency activities and the reception activities are essentially calculated before the start of the measurement has little flexibility since it does not enable any modification of the parameters in the running sequence. Since all pre-calculated values must be stored, further, it has a high memory capacity requirement. For the reasons initially explained, the possible performance of the gradient amplifiers is not optimally exploited because of the necessary worst case dimensioning. The point-by-point imaging from the logical into the physical coordinate system is extremely calculation-intensive.

Figure 8:
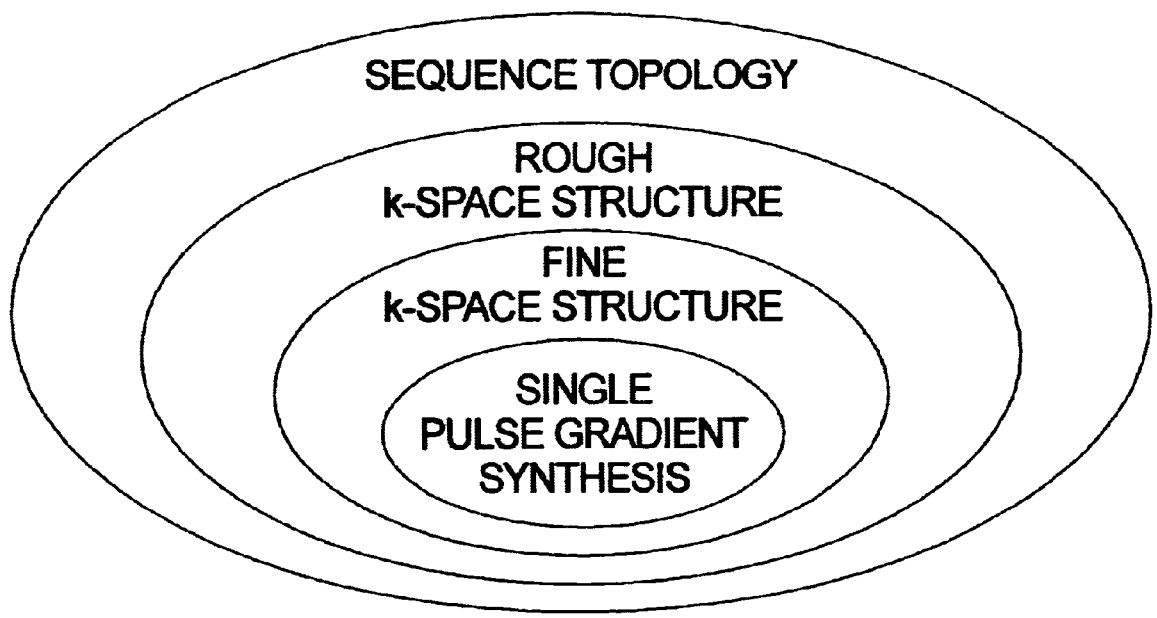
FIG. 8 illustrates the general concept of the inventive controller.

The general concept of an inventive procedure for avoiding the aforementioned disadvantages is shown as an example in FIG. 8. MR sequences can be classified into a number of hierarchy levels:

The outer layer represents the sequence topology, for example FLASH, spin echo, turbo-spin echo, etc.

The layer lying therebelow (rough k-space structure) represents, for example, the segmentation type of the k-space. For example, there are sequences wherein the k-space is not occupied in chronologically linear sequence or in which only half the k-space is covered.

The inner layer (fine k-space structure) corresponds to more detailed problems such as the distribution of a phase coding gradient onto a plurality of time slices, for example before and following a 180° pulse given spin echo sequences.

The innermost layer (single pulse gradient synthesis) represents, for example, the synthesis of the gradient shape between two radio-frequency activities.

Only the innermost layer is hardware-determined, i.e. it requires a detailed knowledge of the apparatus parameters. All outer layers directly influence the contrast behavior and represent non-machine specific knowledge, for example relaxation times and decisions about the sequence topology.

The innermost layer (and only this) represents an abstraction envelope around the scanner hardware and is therefore available for an automation. Accordingly, one proceeds as follows in the sequence control:

The calculation of the control dataset is undertaken during the running time of the sequence. As a result, the sequence execution with minimal "dwell" time cannot be deterministically controlled. Moreover, the memory capacity requirement for the control dataset is eliminated since only the part required at the moment is calculated "on demand".

The calculation of the control dataset is divided into two parts, namely the above-explained innermost layer and the rest. The part corresponding to the innermost layer is performed by the operating system of the controller; the other hierarchy levels, by contrast, correspond to the actual sequence program.

Figure 9:
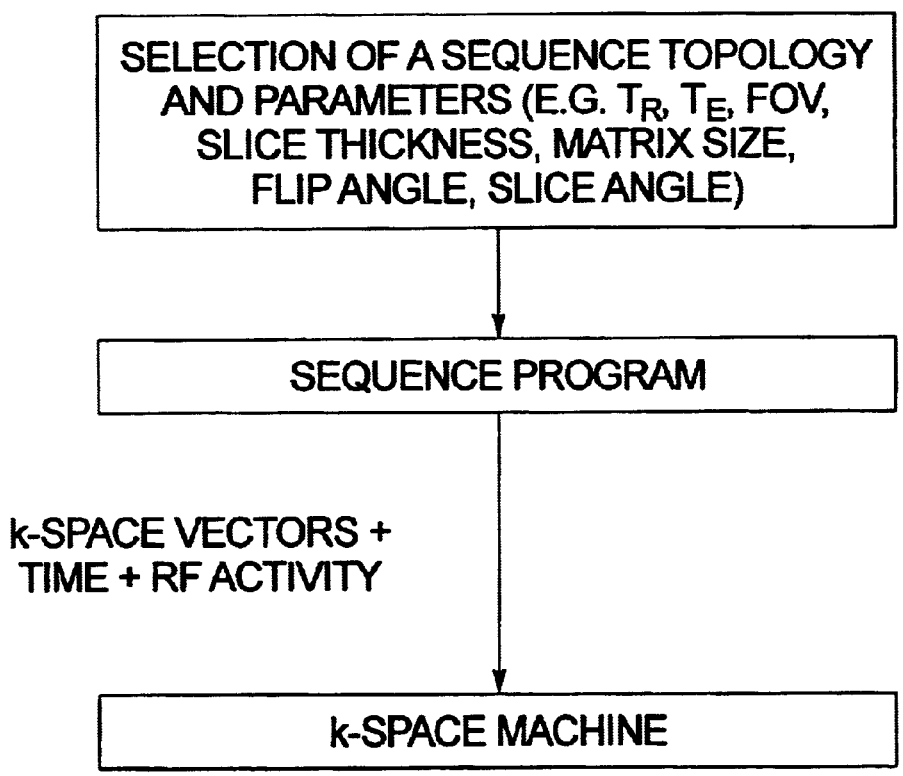
FIG. 9 shows the division of the sequence controller.

This procedure is schematically presented on the basis of a block diagram according to FIG. 9. First, the operator selects a sequence topology and parameters appertaining thereto such as, for example, repetition time TR, echo time TE, field of view FOV, slice thickness, matrix size, flip angle and slice angle. The sequence program is subsequently produced. The program forwards specifications in the form of k-space vectors, of time particulars and of the transmission or reception phases to the so-called k-space machine that, based on these quantities, supplies control signals to gradient amplifiers and radio-frequency transmission and reception unit during the sequence execution. The term "k-space machine" was selected because, differing from the usual case, it is not gradient amplitudes but k-space values that are directly transferred, this significantly simplifying the programming. In a status model, the statuses of the controller can be described as follows:

In nuclear magnetic resonance tomography, there are two means available for influencing the nuclear spin collective: radio-frequency pulses and gradient fields. The control of these means requires basically four phases:

radio-frequency transmission phase or reception phase warp phase waiting phase

During the execution of the measurement, the sequence program driving the system controller supplies a sequence of specifications of time slices that respectively belong to one of the four phases. From these particulars, the system controller calculates the gradient current shape and, possibly, radio-frequency activity to be realized in the next time slice. As a result, a dwell of a maximum of one time slice derives. The specification of the time slices ensues abstractly, for example by direct specification of k-space positions. In the phases already described above, the radio-frequency transmission phase or reception phase characterized by a gradient (which may be simultaneous for both phases) that exhibits a constant gradient amplitude or a permanently prescribed gradient form. These individual phases were already discussed above.

Only the warp phase still requires specific explanation: A warp phase must generate defined gradient time integrals or defined moments $M_k$:

$$M_k = \int_0^T \tau^k G(\tau) d\tau$$

A $0^{th}$ moment $M_0$ corresponds to a k-space distance $\Delta k = \gamma \cdot M_0$. A first moment $M_1$ is a criterion for a motion sensitivity of the sequence. Predetermined first moments are taken into consideration in, for example, a gradient motion refocusing (GMR) or motion measurement. Higher moments $M_{k>2}$ are only considered in special instances. Further, a warp phase has the task of constantly connecting gradient amplitudes of radio-frequency transmission phases or reception phases that are immediately adjacent in time with one another, within the power limits of the gradient system.

The optimum gradient current shape during the warp phase can, for example, be fully automatically calculated by the control computer from the specification of the k-space distance to be covered supplied by the sequence program. The k-space vectors defined by the sequence program also represent the slice positions (potentially oblique). A vector transformation into the physical coordinate system is conducted first and only then is the optimum gradient current shape calculated. One thus avoids the initially described problem of conventional systems that complex current-time curves that are difficult for the gradient amplifier to govern arise in the conversion of pre-defined logical gradients into physical gradients. Moreover, the gradient system can also be utilized better given oblique slices since, differing from conventional systems, the sequence definition need not be based on the worst case with respect to the slew rate and the amplitude. Finally, the programming of the sequence is considerably simplified given this procedure. Both the aforementioned vector rotation as well as the calculation of the optimum gradient current shape ensues during the sequence execution.

A simple calculation of an optimum trapezoidal dephasing gradient pulse train with a given current-time area, i.e., a $0^{th}$ moment $M_0$ for a given overall time T and a given constant slew rate $\dot{G}$, is presented below on the basis of FIG. 11 as an example for a time slice that a wrap phase.

Given a constant slew rate $\dot{G}$ and minimum number of gradient ramps, the unknown intermediate gradient $G_1$ is derived for a dephasing pulse of the $0^{th}$ order given a start gradient $G_0$ and an end gradient $G_2$ with an overall time T and a gradient-time integral (k-space distance) of $$M_0 = \int_0^T G(t) dt.$$

$$G_1 = \frac{M_0 - \frac{1}{2}(G_0 + G_2)T_{02}}{T - T_{02}} \quad (1)$$

with $$T_{02} = \frac{|G_2 - G_0|}{\dot{G}}$$

When $G_1 > \max(G_0, G_2)$, $G_1$ is in fact $$G_1 = \max(G_0, G_2) + r\dot{G} \quad (3)$$

Correspondingly, for $G_1 < \min(G_0, G_2)$, $$G_1 = \min(G_0, G_2) - r\dot{G}. \quad (4)$$

with the auxiliary expression $$r = \frac{T - T_{02}}{2} - \sqrt{\frac{T^2 - T_{02}^2}{4} - \frac{\left|M_0 - \frac{1}{2}(G_0 + G_2)T\right|}{\dot{G}}} \quad (5)$$

When the root argument is negative or $G_1$ exceeds the amplitude limit, the entire gradient pulse train cannot be realized within the specifications.

The ramp times $T_{01}$ and $T_{12}$ and the roof time $T_1$ derive from $$T_{01} = \frac{G_1 - G_0}{\dot{G}} \quad (6)$$

$$T_{12} = \frac{|G_2 - G_1|}{\dot{G}} \quad (7)$$

$$T_1 = T - T_{01} - T_{12} \quad (8)$$

Figure 11:
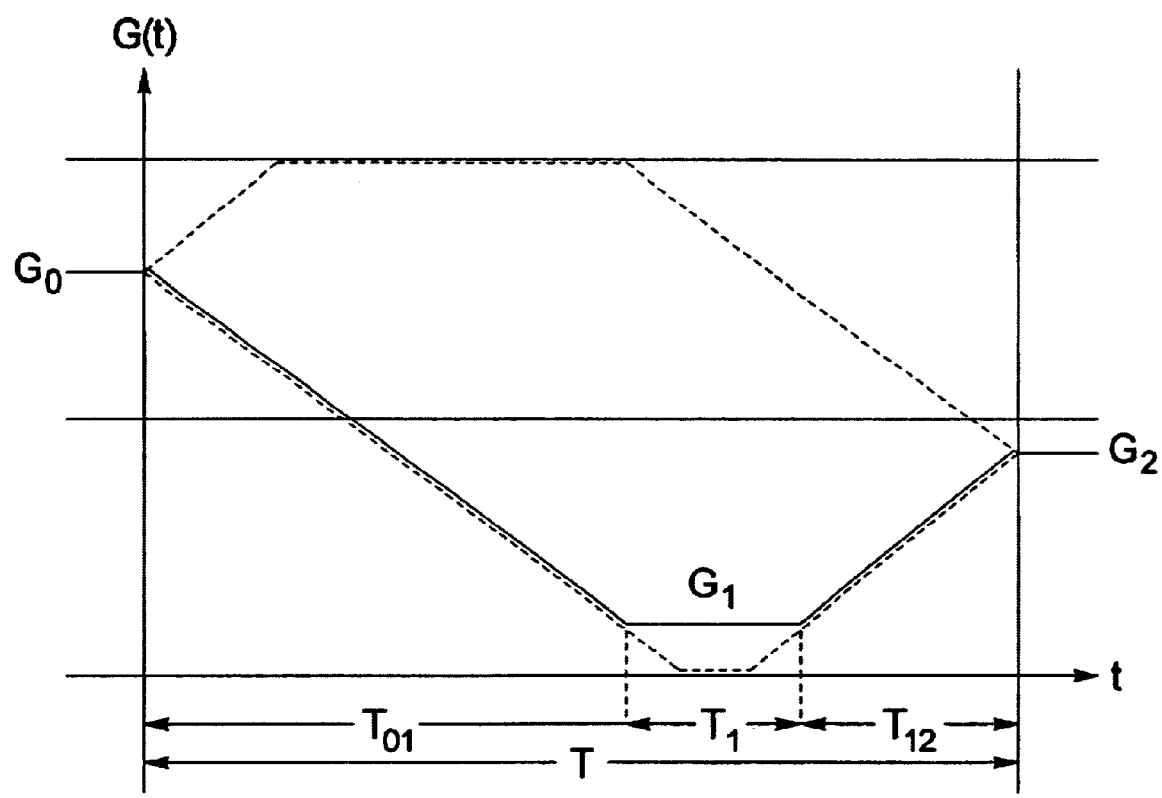
FIG. 11 is a gradient time curve for realizing a $0^{th}$ moment in a warp phase according to the invention.

That region within which the gradient pulse train shown with a solid line is to be designed, taking the aforementioned boundary conditions into consideration, is shown with a broken limiting line in FIG. 11. Lower and upper plateaus of the limiting line arise from device-oriented limitations of the gradient system that, for example, only permits a certain maximum gradient amplitude.

Accordingly, gradient pulse trains are calculated for a predetermined minimum slew rate or an overall time to be minimized.

An expansion of the design task according to FIG. 11 arises given an additional specification of a first moment $M_1$. One approach as a solution of the design task is graphically explained on the basis of FIG. 12. Similar to FIG. 11, the presentation in FIG. 12 also ensues as an example for a given overall time T as well as a constant slew rate $\dot{G}$. In accord therewith, the gradient time curve $V_e$ according to FIG. 12—shown with a solid line—generally has three ramps and two internal plateaus. A gradient time curve $V_0$ that derives from a design with only prescription of the $0^{th}$ moment is shown with a broken line. Respective gradient time curves $V_+$ and $V_-$ that generate a maximum first moment $M_1^+$ or a minimum first moment $M_1^-$ are shown with dot-dashed and dotted lines, respectively. All gradient time curves $V_e$, $V_0$, $V_+$ and $V_-$ generate the same $0^{th}$ moment $M_0$. One thereby proceeds, for example, as follows in a design method:

First, a gradient time curve $V_0$ is designed without taking the first moment $M_1$ into consideration. The gradient time curve $V_0$ thereby has a first moment $M_1^0$.

Extreme gradient time curves $V_+$ and $V_-$ are calculated that have the same $0^{th}$ moment $M_0$ as the gradient time curve $V_0$ as well as a maximum first moment $M_1^+$ or a minimum first moment $M_1^-$.

The sought gradient time curve $V_e$ for achieving the desired first moment $M_1$ is correspondingly interpolated between the gradient time curve $V_0$ and one of the gradient time curves $V_+$ and $V_-$. If the desired first moment $M_1$ does not lie between the extreme cases $M_1^+$ and $M_1^-$, it cannot be realized with the given time duration T, given a constant slew rate and given $0^{th}$ moment $M_0$.

In another embodiment of the design task, for example, that minimal slew rate is determined for which one of the extreme gradient time curves $V_+$ or $V_-$ becomes equal to the gradient time curve $V_e$.

Figure 12:
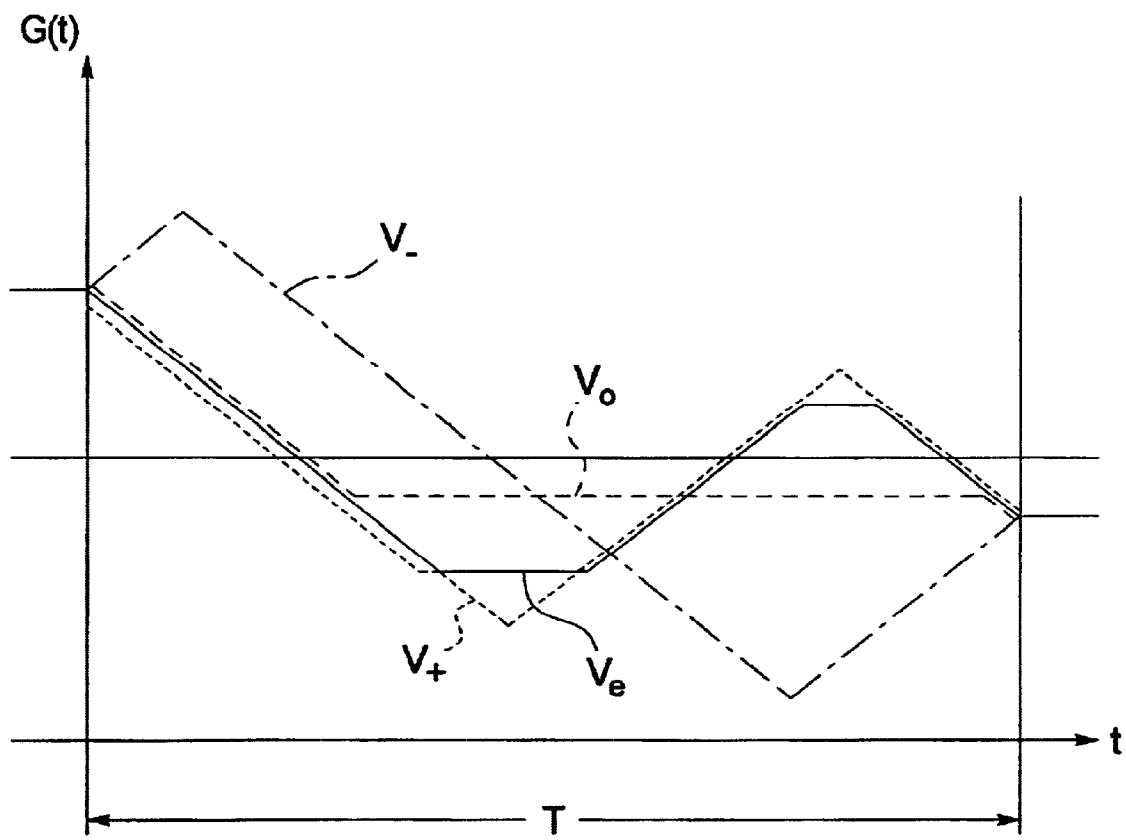
FIG. 12 is a gradient time curve for realizing a $0^{th}$ moment and, at the same time, a $1^{st}$ moment in a warp phase according to the invention.

The procedure in the design of a gradient time curve for a gradient axis is treated in FIG. 12, hereby a $0^{th}$ and a first moment are predetermined for the one gradient axis. One proceeds correspondingly in the design of gradient time curves for all three gradient axes when a $0^{th}$ and a first moment are predetermined per gradient axis. When, in contrast thereto, first moments are only predetermined for, for example, two gradient axes, then this generally initially leads to a design solution that is not unambiguous. One of the moments is thereby not prescribed for an $M_1$ vector containing three first moments corresponding to the three gradient axes, so that an allowable $M_1$ vector describes a straight line in the three-dimensional space of the gradient axes. Further, the maximum and minimum moments $M_1^+$ and $M_1^-$ of all three gradient axes define a cuboid within which the allowable $M_1$ vector must lie. An $M_1^0$ vector that is easy to calculate lies within the aforementioned cuboid is utilized, for example, in order to arrive at an unambiguous solution. An unambiguously defined $M_1$ vector is obtained, for example, from an orthogonal projection of the $M_1^0$ vector onto this straight line. If this yields a projection point outside the cuboid, then the intersection of the straight line with the corresponding cuboid boundary yields the unambiguously defined $M_1$ vector. The direction can be calculated, toward one of the extreme moments $M_1^+$ or $M_1^-$, that a first moment $M_1$ to be determined differs from $M_1^0$. Thus a number of actually needed extreme moments can be limited to a maximum of one per gradient axis given the above-described procedure.

One proceeds in a corresponding way given a prescription of only one first moment for one of the gradient axes. An allowable $M_1$ vector thereby defines a plane onto which, for example, the $M_1^0$ vector is projected for acquiring an unambiguously defined $M_1$ vector.

Figure 13:
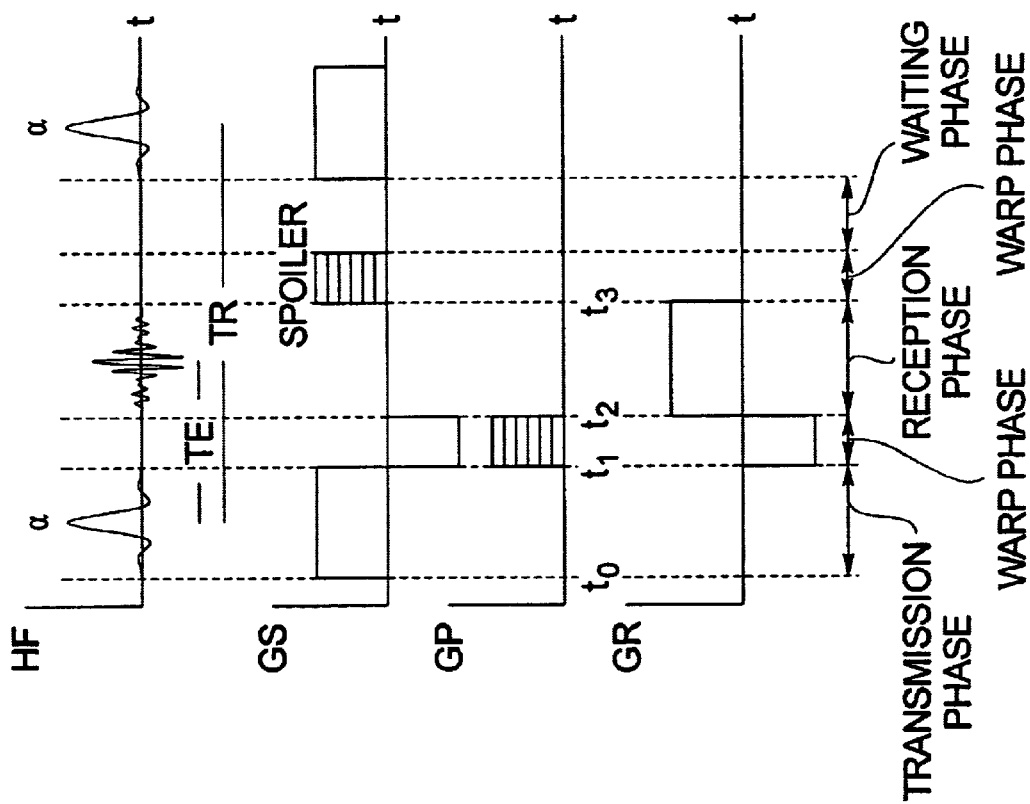
FIG. 13 is an excerpt from a FLASH sequence shown in the time domain.

FIG. 13 shows an excerpt from a FLASH sequence illustrated in the time domain that, for example, is selected by a user. For example, the user selects the following parameters of the FLASH sequence in conformity with the desired properties of a magnetic resonance image to be registered: repetition time TR, echo time TE, field of view, slice thickness, matrix size, flip angle α and angulation.

Among other things given conventional conversion of the measuring sequence that has been set, gradient current time functions in a logical coordinate system GS, GP and GR are formed according to the set parameters from time gradient pulses deposited in a library, and these gradient current time functions are time-equidistantly divided into discrete values and, finally, are converted point-by-point from the logical coordinate system into the physical coordinate system x, y and z, particularly given oblique and doubly oblique slices, and are forwarded point-by-point to, for example, a gradient amplifier that is to be driven. This conventional conversion exhibits the disadvantages that have already been described, for instance little flexibility, high memory space needs, sub-optimum utilization of the gradient system and high data stream rates.

According to the invention, the FLASH sequence with the selected parameters is converted as follows: The sequence that has been set is presented as a sequence of specified time slices, characterized by time slice specifications ZS ($k_S$, $k_R$, $k_P$, phase identifier, t). One of the time slice specifications ZS thereby contains a k-space vector within the logical coordinate system with the elements $k_S$, $k_R$, $k_P$. The phase identifier characterizes one of the four phase types, and the time identifier t characterizes, for example, a starting time of a phase. A time slice specification ZS is thereby only necessary per change of the phase types within a pulse sequence. In one embodiment, the time slice specifications ZS are supplemented by a particular of first moments per coordinate axis.

Figure 14:
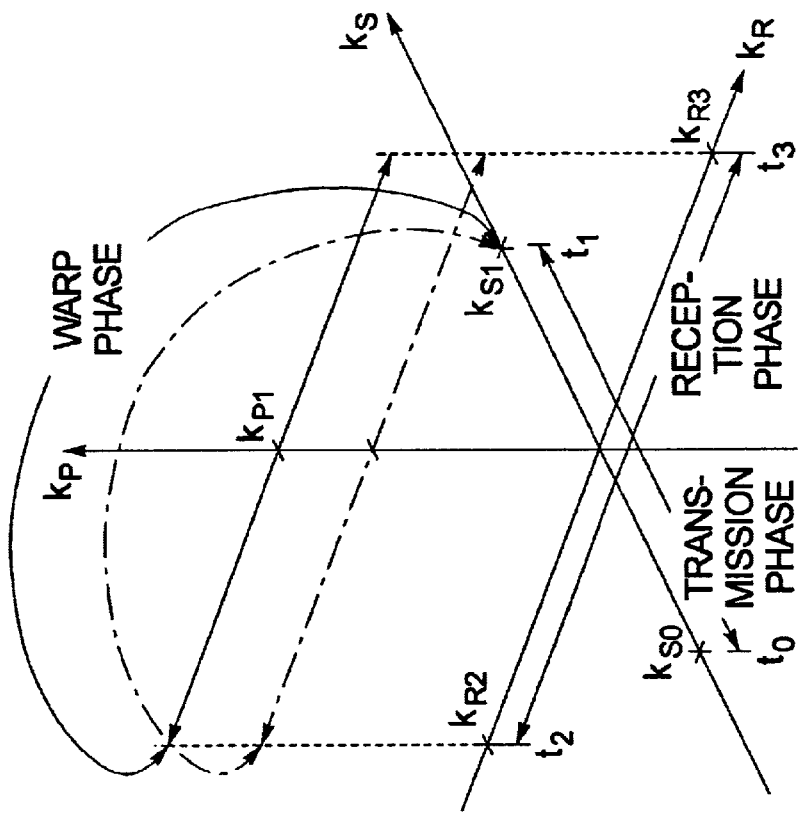
FIG. 14 is an excerpt from the FLASH sequence according to FIG. 13 shown in k-space.

The aforementioned is explained as an example in conjunction with FIG. 14 for the FLASH sequence shown in FIG. 13. The transmission phase begins at a time $t_0$. Accordingly, a time slice specification $ZS_0$ is allocated to this point in time that contains respective values for the three k-space coordinates $k_S$, $k_R$, and $k_P$; for example, ($k_S=k_{S0}$, $k_R=0$, $k_P=0$, transmission phase, $t=t_0$) is valid for the time slice specification $ZS_0$. The end of the transmission phase and, at the same time, a start of a first warp phase are characterized by a second time slice specification $ZS_1$ ($k_S=k_{S1}$, $k_R=0$, $k_P=0$, warp phase, $t=t_1$). Further, the end of the first warp phase and, at the same time, the beginning of a reception phase are described by a time slice specification $ZS_2$ ($k_S=0$, $k_R=k_{R2}$, $k_P=k_{P1}$, reception phase, $t=t_2$). Further, an end of the reception phase and, at the same time, a start of a second warp phase are characterized by a fourth time slice specification $ZS_3$ ($k_S=0$, $k_R=k_{R3}$, $k_P=k_{P1}$, warp phase, $t=t_3$), etc.

Given exposures of oblique and doubly oblique tomograms, a rotation of the k-space vectors of the time slice specification ZS from the logical into the physical k-space system $k_x$, $k_y$ and $k_z$ ensues during an implementation of the FLASH sequence in the k-space machine. This occurs with little calculating outlay, for example in the controller CPU 21 functioning as a k-space machine. The computation-intensive and time-critical transformation of the conventional supporting point data streams is thereby avoided. According, for example, to a design method described for FIGS. 11 and 12, further gradient current time functions—among other things—are formed and correspondingly implemented by the gradient system. The above-described prescription of a complete sequence in the form of a k-space structure and the conversion thereof with a k-space machine, for example, allow the DSPs 22, 23 and 24 to be completely eliminated or can be replaced by simple and economic ASICs.

The manner by which corresponding gradient current time functions are generated from the time slice specification in the k-space machine is explained below. For allowing a simple presentation, it is thereby assumed that a non-oblique slice is to be registered, so that the logical coordinate system is equal to the physical coordinate system without transformation.

Given knowledge of the time slice specifications $ZS_0$ and $ZS_1$, a signal is given that a constant slice selection gradient GS with a constant strength that is encrypted in the values $k_{S0}$ and $k_{S1}$ is to be activated for a time span ($t_1-t_0$) in the framework of a transmission phase. The analogous case applies to a radio-frequency transmission signal that is to be generated in the radio-frequency transmitter unit 15, whereby an unambiguous definition is achieved by the selected flip angle α and the duration ($t_1$-$t_2$) of the transmission phase.

Given knowledge of the time slice specifications $ZS_1$ and $ZS_2$, for example, the controller CPU 21—functioning as a k-space machine—is initiated to determine the gradient current time function that following gradient time integrals adhere to in the framework of the first warp phase having the time duration ($t_2$-$t_1$). A gradient time integral for the slice selection gradient GS is defined by the values $k_S=k_{S1}$ at the time $t=t_1$ and $k_S=0$ at the time $t=t_2$. The same is true of the phase and frequency encoding gradients. The gradient current time functions for achieving the aforementioned gradient time integrals are thereby generally determined in the framework of a classic variation calculation for which analytical and numerical methods are known. Boundary conditions are thereby taken into consideration, for example a steadiness of a gradient current for the slice selection gradient GS that is to be steadily continued from the time $t=t_1$. Moreover, predetermined maximum amplitudes and slew rates of the gradient system are adhered to. Under the given boundary conditions, the procedure and solution in the aforementioned variation calculation are described as an example for FIGS. 11 and 12, so that gradient current time functions corresponding, for example, to FIG. 11 or 12 are obtained for the first warp phase.

The gradient current time function for the readout gradient GR is defined for the first warp phase by a gradient time integral that is characterized by the values $k_R=0$ at time $t=t_1$ and $k_R=k_{R2}$ at the time $t=t_2$. Further, the boundary condition is to be noted that, at time $t=t_2$, the readout gradient GR must have reached a constant value defined by $k_R=k_{R2}$ for the following reception phase.

In the following reception phase, for example, sampling points between the k-space points $k_R=k_{R2}$ at the time $t=t_2$ through $k_R=k_{R3}$ at the time $t=t_3$ of the readout gradient GR are determined by the selected matrix size as well as by the field of view.

The same applies to further time slices. The times $t_1$, $t_2$, $t_3$ and $t_4$ thereby result from the selected echo time TE and repetition time TR.

In the conversion of time slice specifications ZS into gradient current time functions, the controller CPU 21—functioning as a k-space machine—additionally implements, for example, a pre-distortion of the gradient current time functions for eddy current compensation.

The above-described method can be advantageously utilized by a user who develops sequences specifically customized to the user's requirements. The sequence developer is thereby largely relieved of error-prone routine tasks, for example gradient pulse calculations, without being limited in terms of programming freedom. The calculation of gradient current time functions involves a great many limitations as a result of device-oriented limitations. Given a sequence development in the framework of the aforementioned time slice specifications, it is not required for the sequence developer to take all of these limitations into consideration; rather, the device-oriented limitations are inherently taken into consideration by the k-space machine in the implementation of the developed sequence.

According to the invention, the conversion or transformation of the logical into the physically realized gradient-time functions ensues by imaging the gradient-time integrals from the logical into the physical coordinate system before the design of the gradient current/time functions. The gradient current/time functions are subsequently calculated by time slices for each physical gradient axis in real time from the amplitudes of the adjacent time slices and the gradient-time integrals to be realized and, for example, are produced in the form of gradient amplitude/point-in-time dyads. As a result, the calculation-intensive and time-consuming imaging of the supporting point data streams is avoided. The transformation of the gradient-time integrals from the logical into the physical coordinate system as well as the calculation of the gradient amplitude/time function occurs in the controller CPU 21 according to FIG. 2, which functions as a k-space machine.

In an embodiment which still makes use of the three digital processors 22 through 24, during the course of a measurement each of the three digital signal processors 22 through 24 receives a chain of gradient amplitude/point-in-time dyads from the controller CPU 21 functioning as a k-space machine, that represent the corner points in the gradient-time curve. The digital signal processors 22 through 24 interpolate dyads, following one another in real time, into gradient reference values on a discrete gradient scan grid. When the system clock reaches the reference time of the time dyad, then this is discarded and replaced by the next dyad until the reference time thereof is also reached, etc. The respective target times need not lie on the scan grid, so that it is possible to displace the gradient ramps with a significantly finer time resolution than that prescribed by the scan grid. The realized gradient-time integral thus can be precisely controlled even given a rough digitization (sampling) of the gradient amplitude.

In a further embodiment, in addition to this pre-distortion of the gradient currents for the compensation of the gradient-induced eddy currents, frequency offset values for the compensation of gradient-induced shifts of the basic magnetic field by detuning a radio-frequency synthesizer that controls the radio-frequency system are also taken into consideration.

Figure 10:
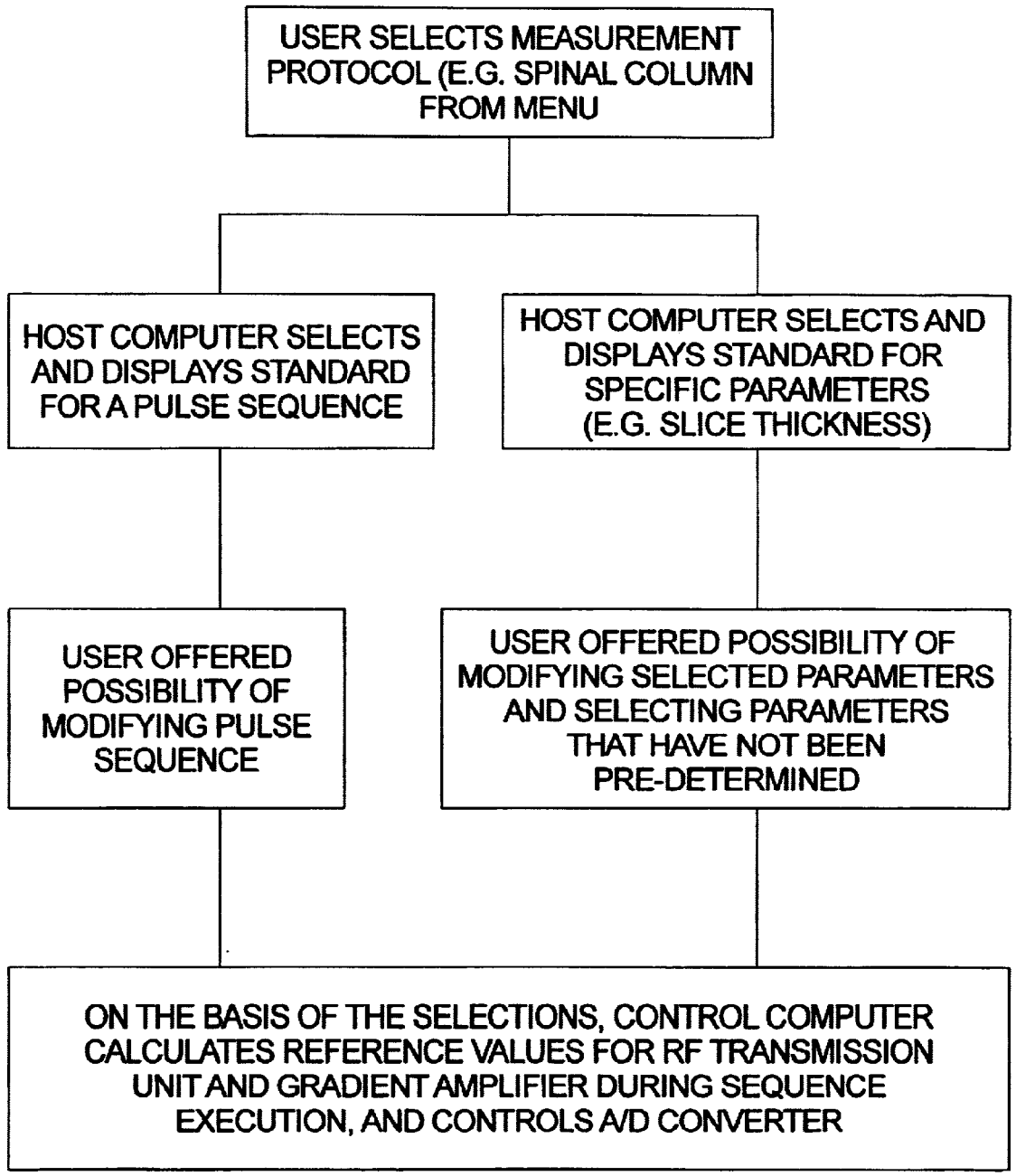
FIG. 10 is a flowchart of an exemplary embodiment of the inventive controller.

FIG. 10 shows a block diagram for the time execution of the control. As in the conventional method according to FIG. 5, the user first selects a measurement protocol, and the HOST computer then selects various standard values that the user can modify. The measurement then starts at this point, whereby the control computer calculates rated values for the radio-frequency transmission unit and gradient amplifiers during the sequence execution on the basis of the predeterminations and controls the ADC converter.

Although various minor modifications might be suggested by those skilled in the art, it should be understood that my wish to embody within the scope of the patent warranted hereon all such modifications as reasonably and properly come with the scope of my contribution to the art.

I claim as my invention:

1. A method for controlling a pulse sequence of a magnetic resonant system, comprising the steps of:

in a magnetic resonant imaging system, prescribing a sequence program as a k-space structure; and generating a control dataset in a physical domain as a pulse sequence for generating magnetic field gradients, emitting radio-frequency pulses, and sampling nuclear magnetic resonant signals from said sequence program prescribed as said k-space structure during an execution time of said pulse sequence.

2. A method as claimed in claim 1 comprising generating a gradient current time function as said control dataset.

3. A method as claimed in claim 1 comprising resolving said k-space structure into a sequence of specified time slices.

4. A method as claimed in claim 3 comprises identifying one of said time slices with a phase identifier which identifies a phase selected from the group consisting of a radio-frequency transmission phase, a radio-frequency reception phase, a warp phase, and a waiting phase.

5. A method as claimed in claim 3 comprising identifying one of said time slices with a time identifier.

6. A method as claimed in claim 3 wherein one of said time slices comprises a k-space vector.

7. A method as claimed in claim 6 comprising said k-space vector in a logical coordinate system.

8. A method as claimed in claim 7 comprising transforming said k-space vector prescribed in said logical coordinate system into a physical coordinate system before calculating said control dataset.

9. A method as claimed in claim 3 wherein one of said time slices comprises at least one moment which is greater than or equal to a first order moment.

10. A method as claimed in claim 9 comprising prescribing said at least one moment in a logical coordinate system.

11. A method as claimed in claim 10 comprising transforming said moment prescribed in said logical coordinate system into a moment of a physical coordinate system before calculating said control dataset.

12. A method as claimed in claim 3 comprising calculating a portion of said control dataset from a selected one of said time slices and from a time slice immediately following said selected one of said time slices.

13. A method as claimed in claim 12 comprising calculating said control dataset in real time.

14. A method as claimed in claim 12 wherein said selected one of said time slices comprises a warp phase, and calculating a gradient current time function for said at least one time slice from a gradient time integral which is predetermined for said at least one time slice and from gradient current amplitudes for a time slice selected from the group consisting of a preceding time slice and a following time slice in said sequence, said gradient time integral and said gradient current amplitudes are defined by k-space vectors for said time slices.

15. A method as claimed in claim 14 comprising pre-distorting said gradient current time function.

16. In a diagnostic magnetic resonant system having gradient coil sets operated by respective gradient amplifiers for emitting gradient magnetic fields, and a radio-frequency system including a radio-frequency transmission channel via which radio-frequency pulses are emitted and a radio-frequency reception channel via which magnetic resonant signals are received, the improvement comprising a controller for operating said gradient amplifiers and said radio-frequency system in a system sequence, said controller comprising a control computer which calculates a control data set for said gradient amplifiers and for said radio-frequency system during a running time of a pulse sequence from a pulse sequence program predetermined as a k-space structure.

* * * * *